United States Patent [19]

Gordon et al.

[11] Patent Number: 4,490,001
[45] Date of Patent: Dec. 25, 1984

[54] DIP CARRIER AND SOCKET

[75] Inventors: Ronald F. Gordon, Mill Valley; Ronald A. Smith, Los Gatos, both of Calif.

[73] Assignee: Matsushita Electric Industrial Co., Ltd., Osaka, Japan

[21] Appl. No.: 576,176

[22] Filed: Feb. 3, 1984

Related U.S. Application Data

[63] Continuation of Ser. No. 464,647, Feb. 7, 1983, abandoned, which is a continuation of Ser. No. 183,383, Apr. 8, 1980, abandoned, which is a continuation of Ser. No. 001,226, Jan. 5, 1980, abandoned.

[51] Int. Cl.³ .............................................. H01R 13/62
[52] U.S. Cl. .......................... 339/17 CF; 339/DIG. 2
[58] Field of Search ...... 339/17 CF, 176 M, 176 MP, 339/DIG. 3

[56] References Cited

U.S. PATENT DOCUMENTS

| | | | |
|---|---|---|---|
| 3,345,541 | 10/1967 | Cobaugh et al. | 339/17 CF |
| 3,407,925 | 10/1968 | Ruehlemann | 339/17 CF |
| 3,656,183 | 4/1972 | Walterscheid | 339/17 CF |
| 3,701,077 | 10/1972 | Kelly, Jr. | 339/17 CF |
| 3,784,957 | 1/1974 | Bailey | 339/17 CF |
| 3,825,876 | 7/1974 | Damon et al. | 339/17 CF |
| 4,146,291 | 3/1979 | Toff et al. | 339/DIG. 3 |
| 4,312,555 | 1/1982 | Donaher et al. | 339/17 CF |

FOREIGN PATENT DOCUMENTS

| | | | |
|---|---|---|---|
| 1918474 | 10/1970 | Fed. Rep. of Germany | 339/17 CF |
| 1152765 | 5/1969 | United Kingdom | 339/17 CF |

*Primary Examiner*—Joseph H. McGlynn

[57] ABSTRACT

A DIP carrier and socket including a generally rectangular socket and mating DIP carrier in which the socket component includes a plurality of contacts disposed along two sides thereof with the terminal portion of each contact extending through the bottom of the socket and the contact portion extending through the side wall and into a carrier-receiving inner receptacle formed in the top of the body. Each end of the socket is provided with keyways. The external perimeter of the carrier body is configured to be matingly received within the socket receptacle and is adapted to receive a DIP in inverted disposition in the bottom thereof. The carrier includes vertical slots formed in each side for receiving the DIP legs in recessed disposition, and a longitudinally extending beam which forms a detent for locking the carrier within the socket. The ends of the carrier are keyed to match the socket keyways and a pull tab is formed on the upper side of the carrier body for facilitating insertion and removal of the carrier into and out of the socket. When the carrier is inserted into the socket, the socket contacts are received within the side slots of the carrier and engage the DIP legs.

1 Claim, 6 Drawing Figures

U.S. Patent  Dec. 25, 1984  Sheet 2 of 2  4,490,001
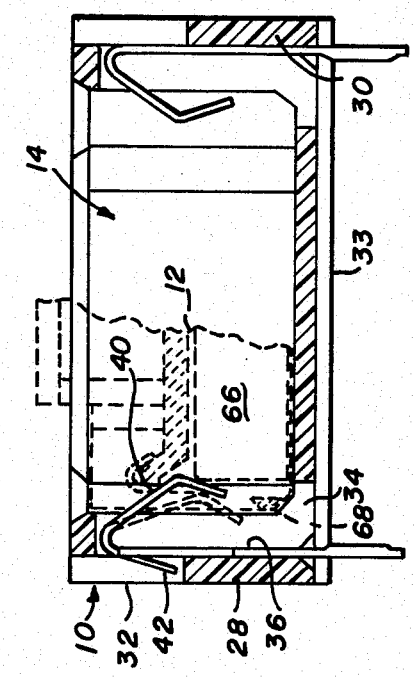
Fig_3
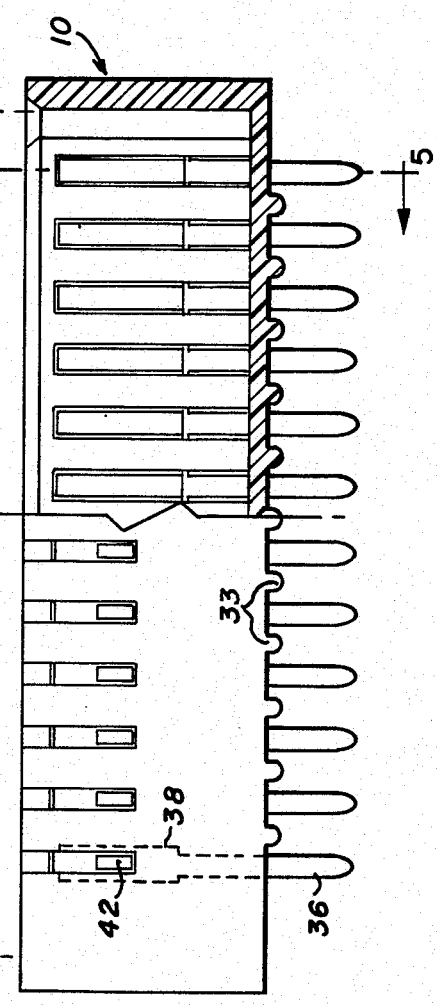
Fig_5
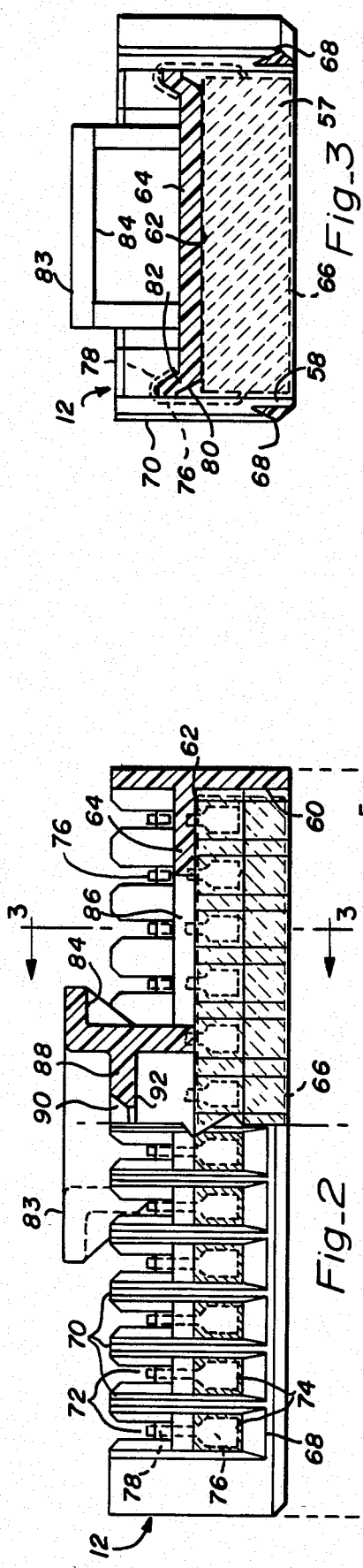
Fig_2
Fig_4

DIP CARRIER AND SOCKET

This is a continuation of application Ser. No. 464,647, filed Feb. 7, 1983, abandoned, which is a continuation of Ser. No. 183,383, filed Apr. 8, 1980, abandoned, which is a continuation of Ser. No. 001,226, filed Jan. 5, 1980, abandoned.

BACKGROUND OF THE INVENTION

1. Field of the Invention

The present invention relates generally to integrated circuit component connector apparatus and more particularly to an improved carrier and socket device for facilitating the connection and disconnection of DIP packaged integrated circuits in electronic apparatus.

2. Description of the Prior Art

Heretofore, integrated circuit components packaged in dual in-line packages (DIPs) have been either soldered directly to a printed circuit board or have been mounted on a multi-pronged carrier which is in turn plugged into a fixture on a circuit board. Although such connection is suitable for certain applications, it is not suitable for those applications in which static discharge presents a problem relative to the integrity of the packaged integrated circuit. For example, in circuits such as ROM devices, static charge transferred from the fingers of one picking up the device to the conductive legs thereof is capable of destroying either the device or the data stored therein, or perhaps even both.

Whereas a DIP permanently soldered to a circuit board is not normally susceptable to static discharge problems, it is not readily removable from the board for testing or replacement. On the other hand, whereas a DIP mounted to a standard plugable carrier is readily removable from the supporting circuit board, it is not free from static discharge problems because the plugable prongs to which it is connected are exposed to the touch of one holding the carrier.

SUMMARY OF THE PRESENT INVENTION

It is therefore a principal object of the present invention to provide a novel socket and removable DIP carrier which protects the DIP from static discharge during handling.

Another object of the present invention is to provide a socket for attachment to a circuit board and a mating DIP carrier which is adapted to be readily insertable and removable from the socket.

Briefly, a preferred embodiment of the present invention includes a generally rectangular socket and mating DIP carrier in which the socket component includes a plurality of contacts disposed along two sides thereof with the terminal portion of each contact extending through the bottom of the socket and the contact portion extending through the side wall and into a carrier-receiving inner receptacle formed in the top of the body. Each end of the socket is provided with keyways. The external perimeter of the carrier body is configured to be matingly received with the socket receptacle and is adapted to receive a DIP in inverted disposition in the bottom thereof. The carrier includes vertical slots formed in each side for receiving the DIP legs in recessed disposition, and a longitudinally extending beam which forms a detent for locking the carrier within the socket. The ends of the carrier are keyed to match the socket keyways and a pull tab is formed on the upper side of the carrier body for facilitating insertion and removal of the carrier into and out of the socket. When the carrier is inserted into the socket, the socket contacts are received within the side slots of the carrier and engage the DIP legs.

Among the many advantages of the present invention are that it provides a means for making a DIP readily interchangeable in a functional circuit.

Another advantage of the present invention is that it enables a DIP to be readily removed for testing or substitution.

Still another advantage of the present invention is that the carrier protects the DIP leads from contact with the fingers of a holder and therefore isolates the contained integrated circuit from static charge.

These and other objects and advantages of the present invention will no doubt become apparent to those skilled in the art after having read the following detailed description of a preferred embodiment which is illustrated in the several figures of the drawing.

IN THE DRAWING

FIG. 2 is a side elevation of a DIP carrier broken along the line 2—2 shown in FIG. 1;

FIG. 3 is a cross-sectional view of the DIP carrier taken along the lines 3—3 of FIGS. 1 and 2;

FIG. 4 is a side elevational view of the socket broken away along the line 4—4 as shown in FIG. 1;

Figures 1, 6:
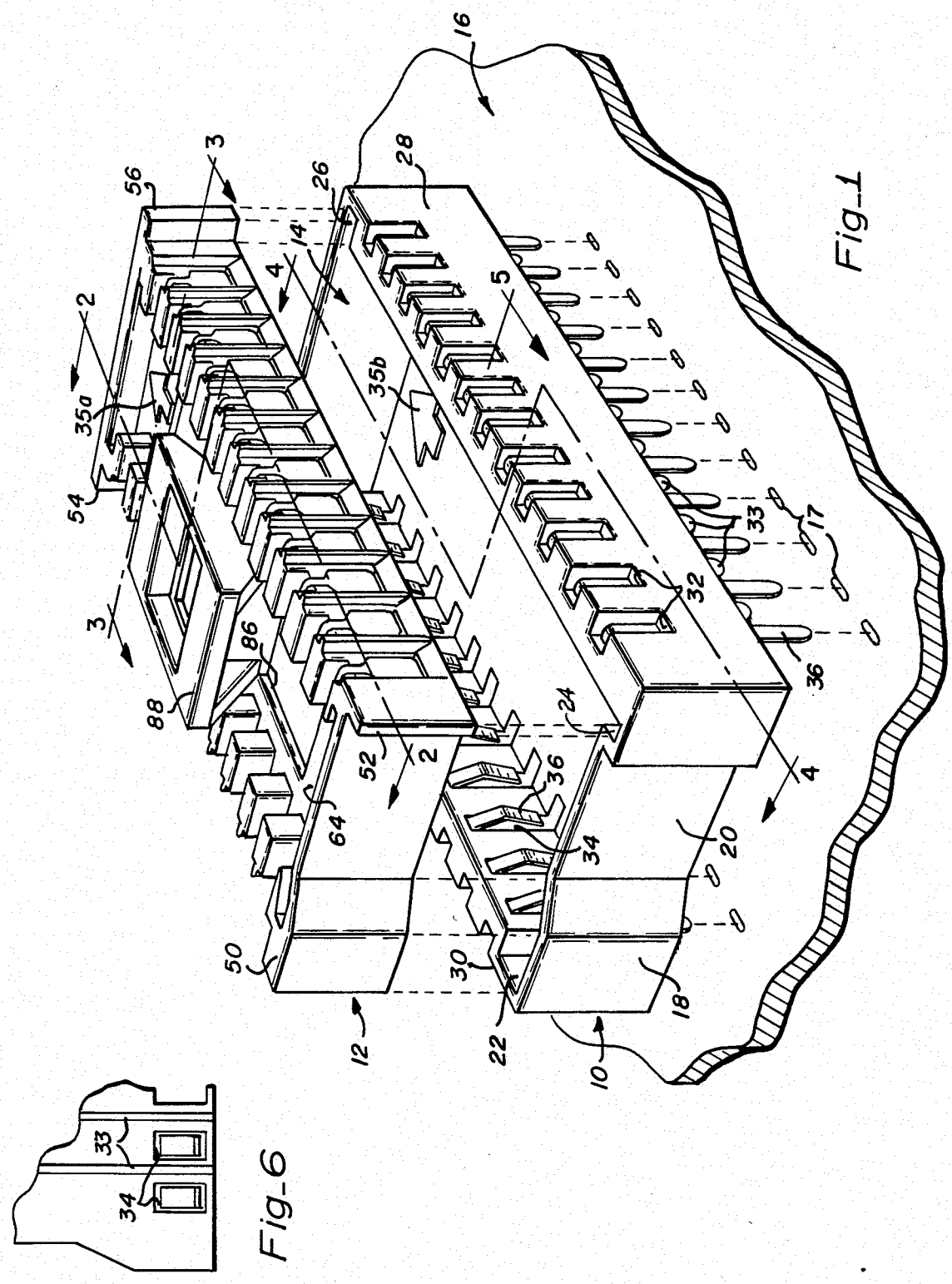
FIG. 1 is an exploded perspective view showing a socket and DIP carrier in accordance with the present invention.

FIG. 5 is a cross-sectional view of the socket taken along the lines 5—5 of FIGS. 1 and 4; and FIG. 6 is a broken segment of a bottom plan view of the socket shown in FIGS. 1, 4 and 5.

DETAILED DESCRIPTION OF THE PREFERRED EMBODIMENT

Referring now to FIG. 1 of the drawing, there is shown a socket 10 and a mating DIP carrier 12 with the carrier 12 being positioned in exploded relationship above the mating receptacle 14 formed in the top of socket 10. For purposes of illustration, socket 10 is shown disposed above a printed circuit board 16 onto which it is to be mounted.

Referring now additionally to FIGS. 4 and 5, it will be noted that socket 10 is generally rectangular in configuration with the exception that the end wall 18 has an offset 20 for accommodating a pair of keyways 22 and 24. At the opposite end of socket 10, a pair of laterally-extending keyways 26, one of which is not shown, are also provided. The side walls 28 and 30 are provided with exterior slots 32 and intersecting interior slots 34 which receive contact members 36 as shown in FIG. 5. As indicated in the broken segment of a bottom plan view shown in FIG. 6, the contact receiving slots 34 are T-shaped in cross-sectional configuration. Contact members 36 are of conventional configuration and includes tapered lower extremities for engaging PC board apertures 17, a widened upper section, illustrated by the dashed lines 38 in FIG. 4, and a cantilevered spring contact arm 40 which after insertion into the slot extends into the cavity 14. The widened portion 38 includes a resilient lock tab 42 which springs into the slot 32 as a member 36 is pushed into slot 14 from the bottom and serves to lock the member 36 in place.

The bottom surface of socket 10 is flat except for the integrally formed transverse ribs 33 which extend thereacross to strengthen the socket structure. In addition, the ribs 33 serve as standoffs for raising the main body of the socket above the board surface to which the device is mounted. The inside surface of the socket bottom is plain except for an arrowhead 35b which is molded therein as an alignment reminder. An identical arrowhead 35b is molded into the carrier 12.

Carrier 12 is also generally rectangular in external configuration except that at one end it is provided with protruding key projections 50 and 52 which are adapted to mate with the keyways 22 and 24, respectively, of socket 10, and at the other end it is provided with laterally extending key projections 54 and 56 which mate with the keyways 26 at the corresponding end of socket 10. As illustrated in FIGS. 2 and 3, the bottom of carrier 12 is provided with a rectangular cavity 57 defined by the interior side walls 58, end walls 60 and the bottom surface 62 of a web 64 that extends along the length of the carrier. The purpose of the cavity is to provide a chamber for receiving the body of a DIP 66 as shown by the dashed lines in FIGS. 2 and 3.

The sides of the carrier 12 are configured to include a detent beam 68 which extends along the length of each side wall, and a plurality of upstanding posts or ribs 70. The ribs 70 are narrow and shallow from beam 68 to the junction of web 64 so as to provide wide openings 74 (FIG. 2) for receiving the knee portion of the DIP legs 76, but are wider and deeper above web 64 so as to provide narrow slots 72 for receiving the tips of the DIP legs as indicated at 78 (FIGS. 2 and 3).

As indicated in FIG. 3, the junction of web 64 with the ribs 70 is made with an upward flare so that the edge portion provides a camming surface 80 for guiding the DIP legs into the slots 72 as the DIP body is inserted into the chamber 57. The upper extremity of the flared portion 82 also provides a shoulder over which the extremity 78 of the DIP legs may be formed to both secure the DIP in the carrier and cause a flat side contact surface to be presented within the slots 72 and 74.

Formed in the central portion of web 64 is a pull tab 83 having flanges 84 on either end to provide a gripping surface with which the carrier may be held between the thumb and index finger of a user. In order to provide additional clearance for the thumb and index finger, apertures 86 are provided in the web 64 on each side of the pull tab 83. The center of pull tab 83 is recessed both top and bottom to provide a thin web 88 having a rectangular aperture 90 formed therein. The aperture 90 provides entry way for an auxiliary lifting tool (not shown). In order to use such tool, which might, for example, have an inverted T-shaped lower extremity, the T-shaped portion would be inserted through slot 90 and the tool rotated so as to engage the lower surfaces 92 of web 88 and thereby allow carrier 12 to be lifted out of engagement with socket 10.

Note by comparing FIG. 2 to FIG. 4 that the slots 72 and 74 of carrier 12 are aligned with the contacts 36 in socket 10, and by comparing FIG. 3 to FIG. 5 that the contact arms 40 extend into the path taken by carrier 12 as it mates with socket 10. This, of course, means that as the carrier is inserted into the cavity 14 the arms 40 will cam over the beams 68 and spring into slots 74 to engage the DIP legs 76. In FIG. 5, a partially broken carrier 12 is shown in phantom lines in mating relationship with socket 10 so as to illustrate the manner in which the contacts 40 engage the legs of the DIP 66.

The beam 68 also provides a detent that cooperates with contact arms 40 to maintain the carrier locked in engagement with the socket.

In accordance with the present invention, the spring force of contact arms 40 is selected so that approximately three pounds of withdrawal force must be applied to tab 83 before the carrier will separate from the socket. This also insures that adequate contact engaging force is applied between arms 40 and DIP legs 76.

In the preferred embodiment the carrier 12 is molded of a glass and carbon-filled polymeric thermo-plastic or thermo-set material such as nylon or polypropylene material having approximately $10^5$ ohm-cm of surface resistivity. By using such material static charge will be dissipated by the material without damaging the integrated circuit contained in the DIP but will provide adequate insulation between the DIP legs. The carrier 12 is a monolithically molded unit and with the exception of the contact pins 40, so is the socket 10. The only manufacturing step required in completing socket 10 after it is molded is to insert the contact pins 40 into the openings 34 provided in the bottom surface.

In use, the socket 10 is mounted to a printed circuit board 16 or the like by inserting the contact pins 36 into openings 17 as illustrated in FIG. 1 and appropriately soldering the pins to leads formed on the lower side of the board. Socket 10 will rest directly upon the surface of the board but will be slightly separated therefrom by the ribs 33. It will be appreciated that once the pins 36 are securely soldered to the underside of the board 16, socket 10 will be rigidly secured thereto.

Insofar as the carrier is concerned, any desired type of integrated circuit (e.g., computer chip, ROM, RAM or otherwise) which is packaged in a standard DIP package may be inserted into the carrier by simply inserting the DIP "legs up" into the cavity of the bottom of the carrier. As the legs 76 engage surface 80, they will be guided into slots 72 as the base of the DIP bottoms out against the underside of web 64. The legs are then deformed around the shoulder 82 and the mounting is complete, and the device is ready to be plugged into a socket.

It is important to note that since the width of the slots 74 is small (typically about 0.070 inches) and the DIP legs are recessed within the slots, one holding the carrier in his hand will not touch the DIP legs even if he should improperly grip the carrier. And even if he were to squeeze the carrier hard enough to cause his skin to touch the DIP legs, any difference in static charge between that of his body and the carrier will have already been dissipated by the semiconductive carrier material.

Use of the present invention makes it possible to easily change the electronic functional or storage capability of any modern electronic device. Furthermore, it makes the removal for testing of a particular circuit component quite simple. And since the volume of space required to accommodate the socket and carrier is only slightly larger than that required by the DIP itself, the device has nearly universal application.

Although the present invention has been described above in terms of presently preferred embodiments, it is to be understood that such disclosure is by way of example only and is not intended to be considered as limiting. Accordingly, it is intended that the appended claims are to be interpreted as covering all alterations and modifications as fall within the true spirit and scope of the invention.

What is claimed is:

1. Apparatus for removably connecting a dual in-line package (DIP) type integrated circuit having a plurality of conductive legs to a circuit board comprising:
   a one-piece carrier made of a semiconductive plastic material for holding said DIP type integrated circuit and a socket member for removably receiving said carrier member, said carrier member including:
   a DIP-receiving portion formed in the underside of the carrier member for receiving the DIP type integrated circuit,
   a pull-tab formed on the underside and centrally of the carrier member for facilitating the insertion and separation of said carrier member to and from said socket member, said pull-tab including flanges formed on the opposite longitudinal sides thereof, said pull-tab further formed with recesses in the top and bottom thereof to provide a relatively thin web having a rectangular opening therein for insertion of an auxiliary lifting tool,
   a plurality of parallel spaced ribs extending generally between the underside and upperside of said carrier member along opposite sides thereof forming slots between adjacent ribs for receiving the individual conductive legs of the DIP type integrated circuit, wherein the space between said slots is sufficiently small so that the recessed DIP legs are prevented from being touched by a person handling said carrier,
   a beam extending generally perpendicular to the direction of said ribs for holding said conductive legs and securing the DIP type integrated circuit in the DIP receiving portion,
   a web connected to said beam, said web including a recess cooperatively positioned relative to the flanges on said pull-tab to provide additional clearance between the flanges and the web to facilitate gripping of the pull-tab and the insertion and separation of the carrier member to and from socket member,
   at least one key portion formed on the peripheral surface of the carrier member, which are in substantial alignment with the vertical reaches of said adjacent ribs and
   said socket member including a one-piece rectangular body and a plurality of contact members for engaging said conductive legs when the carrier member is inserted in the socket member, said rectangular body having:
   a carrier-receiving cavity defined by two side walls, two end walls and a bottom wall for receiving said carrier member,
   at least one keyway portion formed in the inner surface of one of the walls of said carrier-receiving cavity for matingly receiving said key portion of the carrier member to allow the carrier member to mate with the socket member in a preselected orientation only,
   a plurality of exterior slots formed along the outside and upper portions of the opposite side walls, a plurality of interior parallel slots formed along the opposite inner side walls of said rectangular body intersecting said exterior slots and extending to form openings in the bottom wall of said rectangular body, and
   a plurality of transverse projections formed on the bottom wall of said socket member between said adjacent openings and extending between said two side walls of the socket member,
   each of said contact members being held in said rectangular body in the slots formed therein with a pronged portion projecting outwardly through the opening in the bottom wall of the rectangular body formed by said interior slot for engaging said circuit board, and
   a resilient portion extending into said carrier receiving cavity of the rectangular body for engaging said conductive leg of the DIP type integrated circuit.